(12) United States Patent
Chien

(10) Patent No.: US 11,258,438 B1
(45) Date of Patent: Feb. 22, 2022

(54) CONTROL DEVICE OF POWER SWITCH

(71) Applicant: Excelliance MOS Corporation, Hsinchu County (TW)

(72) Inventor: Ming-Hung Chien, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 17/372,547

(22) Filed: Jul. 12, 2021

(30) Foreign Application Priority Data

Jun. 9, 2021 (TW) ................................. 110121054

(51) Int. Cl.
| | | |
|---|---|---|
| *H03K 17/687* | (2006.01) | |
| *H03K 17/082* | (2006.01) | |
| *H03K 19/20* | (2006.01) | |
| *H03K 19/0185* | (2006.01) | |
| *G05F 3/26* | (2006.01) | |
| *H03K 17/18* | (2006.01) | |

(52) U.S. Cl.
CPC ........... *H03K 17/0822* (2013.01); *G05F 3/26* (2013.01); *H03K 17/18* (2013.01); *H03K 17/6871* (2013.01); *H03K 19/018507* (2013.01); *H03K 19/20* (2013.01)

(58) Field of Classification Search
CPC .............. H03K 17/0822; H03K 17/18; H03K 17/6871; H03K 19/018507; H03K 19/20; G05F 3/26

USPC .......................................................... 327/427
See application file for complete search history.

(56) References Cited

U.S. PATENT DOCUMENTS

| | | | |
|---|---|---|---|
| 6,882,513 B2* | 4/2005 | Laraia | H01L 27/0285 361/84 |
| 8,519,773 B2* | 8/2013 | Watanabe | H03K 17/04206 327/434 |
| 9,640,972 B2 | 5/2017 | Kreuter et al. | |
| 10,218,344 B1 | 2/2019 | Lee et al. | |
| 2019/0214973 A1* | 7/2019 | Choi | H03K 3/012 |
| 2021/0258007 A1* | 8/2021 | Wu | H03K 17/04206 |

FOREIGN PATENT DOCUMENTS

| | | |
|---|---|---|
| CN | 109428503 | 3/2019 |
| TW | I586075 | 6/2017 |

* cited by examiner

*Primary Examiner* — Metasebia T Retebo
(74) *Attorney, Agent, or Firm* — JCIPRNET

(57) ABSTRACT

A control device of a power switch includes a voltage boost circuit, a discharge circuit and a bias voltage generating circuit. The voltage boost circuit generates a control voltage at a control end of the power switch by boosting a base voltage. The discharge circuit provides a discharge path between the control end of the power switch and a reference ground end according to a bias voltage. The bias voltage generating circuit compares an output voltage on an output end of the power switch with the control voltage to generate a comparison result, and generates the bias voltage according to the comparison result.

10 Claims, 6 Drawing Sheets

CONTROL DEVICE OF POWER SWITCH

CROSS-REFERENCE TO RELATED APPLICATION

This application claims the priority benefit of Taiwan application serial no. 110121054, filed on Jun. 9, 2021. The entirety of the above-mentioned patent application is hereby incorporated by reference herein and made a part of this specification.

BACKGROUND

Technology Field

The disclosure relates to a control device of a power switch, and more particularly to a control device capable of preventing the power switch from being damaged.

Description of Related Art

In the conventional technical field, in electronic circuits, power switches are often disposed to control whether the power supply voltage is transmitted to the medium of the load device. When an electronic device is turned on, the power switch is turned on according to the received control signal, and the power voltage can be transmitted to the load device; in contrast, when the electronic device is turned off, the power switch is cut off according to the received control signal, and the power voltage is not transmitted to the load device.

In the conventional technical field, when the power switch needs to be turned off, the gate of the N-type transistor that configures the power switch receives a relatively low control voltage, so the transistor can be turned off smoothly. Meanwhile, since the voltage value on the output end of the power switch is still maintained at a relatively high voltage value, the source and the gate of the transistor is subjected to a relatively high bias voltage. This excessively high bias voltage may damage the power switch. Under long-term working conditions, the power switch may even burn out.

SUMMARY

The disclosure provides a control device of a power switch capable of effectively reducing the possibility of damage to the power switch.

The control device of the power switch of the disclosure includes a voltage boost circuit, a discharge circuit, and a bias voltage generating circuit. The voltage boost circuit is coupled to the control end of the power switch, and boosts a base voltage to generate a control voltage on the control end of the power switch. The discharge circuit is coupled between the control end of the power switch and the reference ground end and generates a discharge path between the control end of the power switch and the reference ground end according to the bias voltage. The bias voltage generating circuit is coupled to the discharge circuit, compares the output voltage on the output end of the power switch to the control voltage to generate a comparison result, and generates the bias voltage according to the comparison result.

Based on the foregoing, the embodiment of the disclosure compares the voltage on the output end of the power switch and the voltage on the control end, and determines whether to discharge the control end of the power switch through the comparison result. In this way, the possibility of damage to the power switch due to the excessive voltage difference between the control end and the output end can be effectively reduced, and the normal operation of the power switch can be maintained.

DESCRIPTION OF THE EMBODIMENTS

Figure 1:
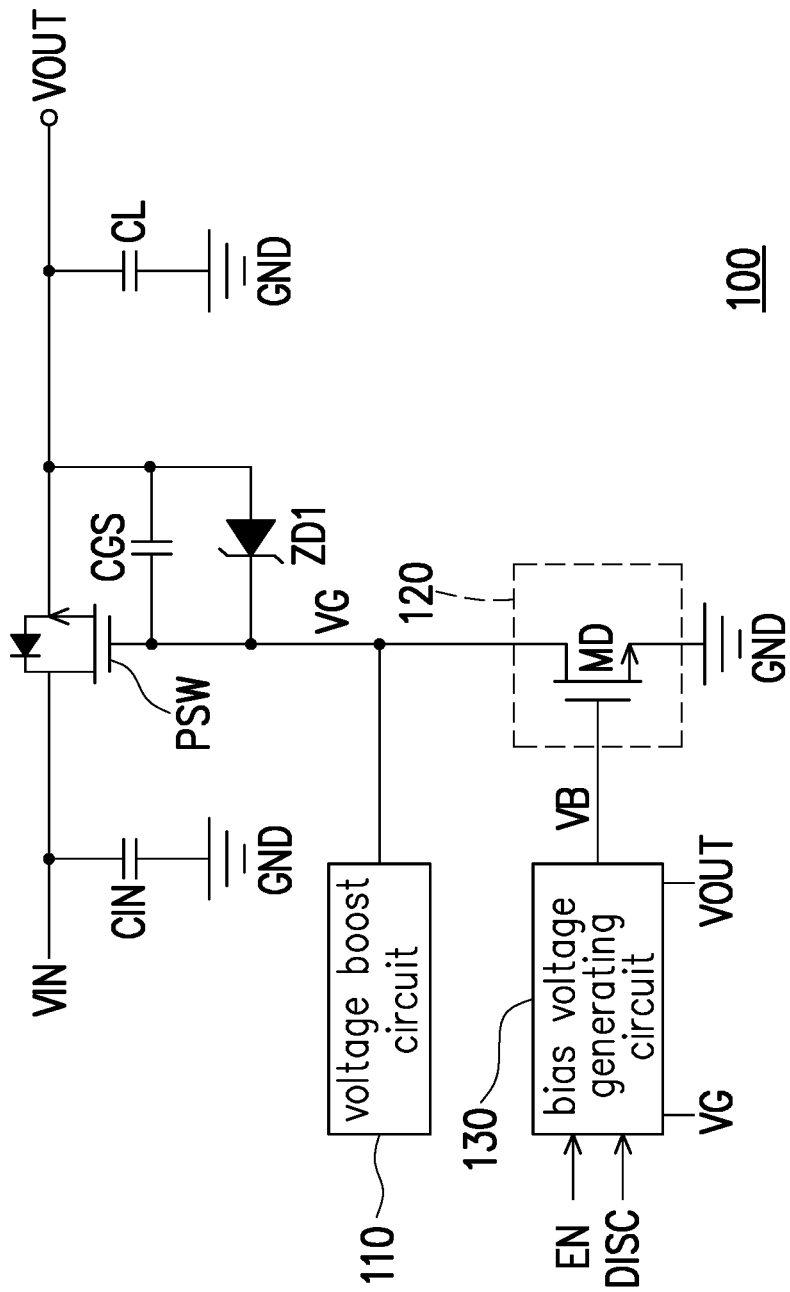
FIG. 1 is a schematic view of a control device of a power switch according to an embodiment of the disclosure.

Referring to FIG. 1, FIG. 1 is a schematic view of a control device of a power switch according to an embodiment of the disclosure. A control device 100 is used to control the on and off actions of a power switch PSW. For example, the power switch PSW includes an N-type transistor. The first end of the power switch PSW receives an input voltage VIN, the second end of the power switch PSW generates an output voltage VOUT, and the control end of the power switch PSW receives a control voltage VG. Moreover, a capacitor CIN is coupled between the first end of the power switch PSW and a reference ground end GND, and a capacitor CL is coupled between the second end of the power switch PSW and the reference ground end GND. Both capacitors CIN and CL can be used as stabilized capacitors. A capacitor CGS is between the control end and the second end of the power switch PSW, and a Zener diode ZD1 is connected to the capacitor CGS in parallel. The anode of the Zener diode ZD1 is coupled to the second end of the power switch PSW, and the cathode of the Zener diode ZD1 is coupled to the control end of the power switch PSW.

The control device 100 includes a voltage boost circuit 110, a discharge circuit 120, and a bias voltage generating circuit 130. The voltage boost circuit 110 is coupled to the control end of the power switch PSW and used to provide the control voltage VG. The voltage boost circuit 110 can boost voltages based on a base voltage and generate the control voltage VG at the control end of the power switch PSW. In terms of implementation details, the voltage boost circuit 110 can be a charge pump circuit or can also be any voltage boost circuit known to those with ordinary knowledge in the art, and there is no particular limitation.

The discharge circuit 120 is coupled between the control end of the power switch PSW and the reference ground end GND. The discharge circuit 120 generates a discharge path between the control end of the power switch PSW and the reference ground end GND according to a bias voltage VB. In terms of implementation details, the discharge circuit 120 may include a transistor MD. The first end of the transistor MD is coupled to the control end of the power switch PSW, the second end of the transistor MD is coupled to the reference ground GND, and the control end of the transistor MD is coupled to the bias voltage generating circuit 130 to receive the bias voltage VB.

The bias voltage generating circuit 130 receives the output voltage VOUT and the control voltage VG and compares the control voltage VG to the difference between the output voltage VOUT and an offset voltage to generate a comparison result. The bias voltage generating circuit 130 generates the bias voltage VB according to the comparison result. In the embodiment, the bias voltage generating circuit 130 may additionally receive a switch on/off signal EN and an abnormal signal DISC. The switch on/off signal EN is used to indicate whether the power switch PSW is on or off. The abnormal signal DISC is used to indicate whether the system to which the power switch PSW belongs is abnormal. The bias voltage generating circuit 130 generates the bias voltage VB according to the comparison result of the difference between the output voltage VOUT and the offset voltage and the control voltage VG according to the switch on/off signal EN and the abnormal signal DISC.

In terms of action details, when the switch on/off signal EN indicates that the power switch PSW needs to be turned on, and the abnormal signal DISC indicates that the system is not abnormal, the bias generating circuit 130 can turn off the transistor MD through the generated bias voltage VB. Meanwhile, the voltage boost circuit 110 provides a control voltage VG having a relatively high voltage to keep the power switch in an on state. At this time, the output voltage VOUT is substantially equal to the input voltage VIN, and the control voltage VG can be greater than a threshold voltage VTH,N of the output voltage VOUT. The threshold voltage VTH,N is the turn-on voltage of the transistor for the configuration of power switch PSW.

On the other hand, when at least one of the switch on/off signal EN and the abnormal signal DISC changes and indicates that the power switch PSW is turned off, the voltage boost circuit 110 may first stop the boost action. Simultaneously, the control voltage VG at this time is greater than the difference between the output voltage VOUT and the offset voltage, so the bias voltage generating circuit 130 enables the transistor MD (e.g., an N-type transistor) to be turned on according to the comparison result of the control voltage VG and the difference between the output voltage VOUT and the offset voltage through the generated bias voltage VB (having a relatively high voltage value). The control voltage VG is decreased quickly through the discharge path provide by the transistor MD.

Note that the quick decrease of the control voltage VG can reduce the voltage value of the control voltage VG to the difference between the output voltage VOUT and the offset voltage. In response to this, the bias voltage VB generated by the bias voltage generating circuit 130 is changed (changed to have a relatively low voltage value), the transistor MD is turned off, and the discharge action of the control voltage VG is stopped. Then, when the difference between the output voltage VOUT and the offset voltage reduces below the control voltage VG again, the bias voltage generating circuit 130 can turn on the transistor MD again through the generated bias voltage VB.

According to the above, in the embodiment of the disclosure, it is obvious that by turning on and off the transistor MD in different stages, the bias voltage generating circuit 130 can control the voltage difference between the control voltage VG between the control end and the output end of the power switch PSW and the output voltage VOUT not to be too large. Under such conditions, the probability of damage to the power switch PSW can be greatly reduced, and the service life is effectively increased.

Figure 2:
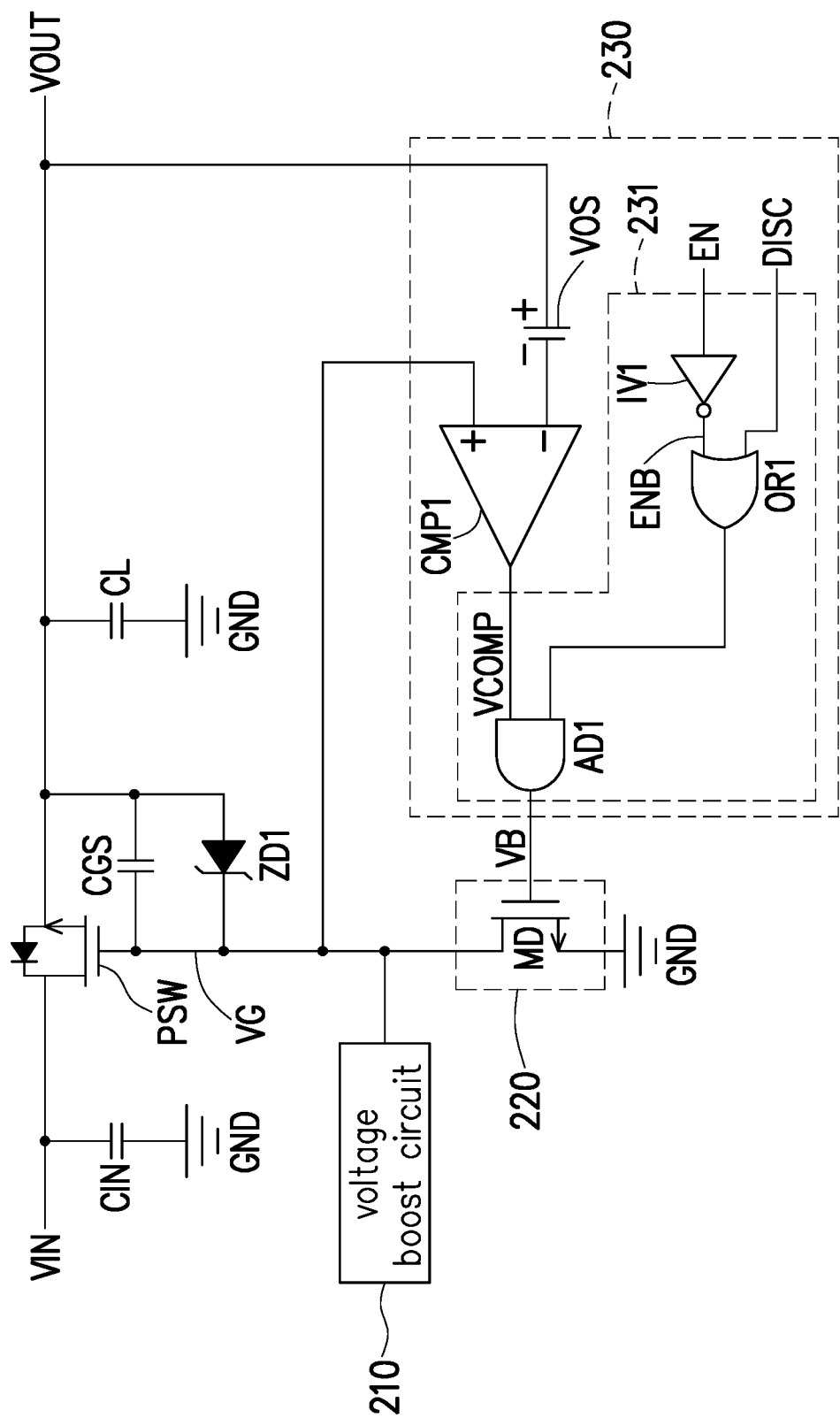
FIG. 2 is a schematic view of a control device of a power switch according to another embodiment of the disclosure.

In the following paragraphs, referring to FIG. 2, FIG. 2 is a schematic view of a control device of a power switch according to another embodiment of the disclosure. In the embodiment, the first end of the power switch PSW receives the input voltage VIN, the second end of the power switch PSW generates the output voltage VOUT, and the control end of the power switch PSW receives the control voltage VG. Moreover, the capacitor CIN is coupled between the first end of the power switch PSW and the reference ground end GND, and the capacitor CL is coupled between the second end of the power switch PSW and the reference ground end GND. Both capacitors CIN and CL can be used as stabilized capacitors. There is a capacitor CGS between the control end and the second end of the power switch PSW, and the Zener diode ZD1 is connected to the capacitor CGS in parallel.

A control device 200 includes a voltage boost circuit 210, a discharge circuit 220, and a bias voltage generation circuit 230. The voltage boost circuit 210 is coupled to the control end of the power switch PSW and used to provide the control voltage VG. The discharge circuit 220 includes the transistor MD and is coupled between the control end of the power switch PSW and the reference ground end GND. The discharge circuit 220 generates a discharge path between the control end of the power switch PSW and the reference ground end GND according to a bias voltage VB.

The bias voltage generating circuit 230 includes a comparator CMP1 and a logic operator 231. The comparator CMP1 can be configured through an operational amplifier. The comparator CMP1 has a positive input end to receive the control voltage VG, and the negative input end of the comparator CMP1 receives the difference between the output voltage VOUT and an offset voltage. The comparator CMP1 compares the control voltage VG to the difference between the output voltage VOUT and the offset voltage and generates a comparison result VCOMP. The logic operator 231 is coupled to the comparator CMP1 and the transistor MD. The logic operator 231 performs a logic operation on the switch on/off signal EN, the abnormal signal DISC, and the comparison result VCOMP and generates the bias voltage VB according to an operation result. In the embodiment, the logic operator 231 can execute or perform an operation on the inversion of the switch on/off signal EN and the abnormal signal DISC to generate a first operation signal and perform an operation on the comparison result VCOMP and the first operation signal to generate a second operation signal. The logic operator 231 generates the bias voltage VB through the second operation signal and provides the control end of the transistor MD with the bias voltage VB.

In the embodiment, an offset voltage generator VOS can be disposed between the negative input end of the comparator CMP1 and the output end of the power switch PSW. Under such a configuration, when the control voltage VG is greater than the difference between the output voltage VOUT and the offset voltage provided by the offset voltage generator VOS, the comparator CMP1 can generate the comparison result VCOMP to be logic 1. In contrast, when the control voltage VG is less than the difference between the output voltage VOUT and the offset voltage, the comparator CMP1 can generate the comparison result VCOMP to be logic 0.

In the embodiment, when at least one of the inversion of the switch on/off signal EN and the abnormal signal DISC is logic 1, and the comparison result VCOMP is also logic 1, the logic operator 231 can generate the second operation signal that is logic 1, and correspondingly the bias voltage VB is provided to the transistor MD to turn on the transistor MD. When the inversion of the switch on/off signal EN and the abnormal signal DISC are not logic 1, and/or the comparison result VCOMP is not logic 1, the logic operator 231 can generate the second operation signal that is logic 0, and correspondingly the bias voltage VB is provided to the transistor MD, so that the transistor MD is turned off.

In terms of hardware architecture, the logic operator 231 includes an inverter IV1, an OR gate OR1, and an AND gate AD1. The inverter IV1 receives the switch on/off signal EN and generates a reverse switch on/off signal ENB. The OR gate OR1 receives the reverse switch on/off signal ENB and the abnormal signal DISC and provides an input end of the AND gate AD1 with the first operation signal. Another input end of the AND gate AD1 receives the comparison result VCOMP, and the output end of the AND gate AD1 generates the second operation result and provides the bias voltage VB.

Figure 3:
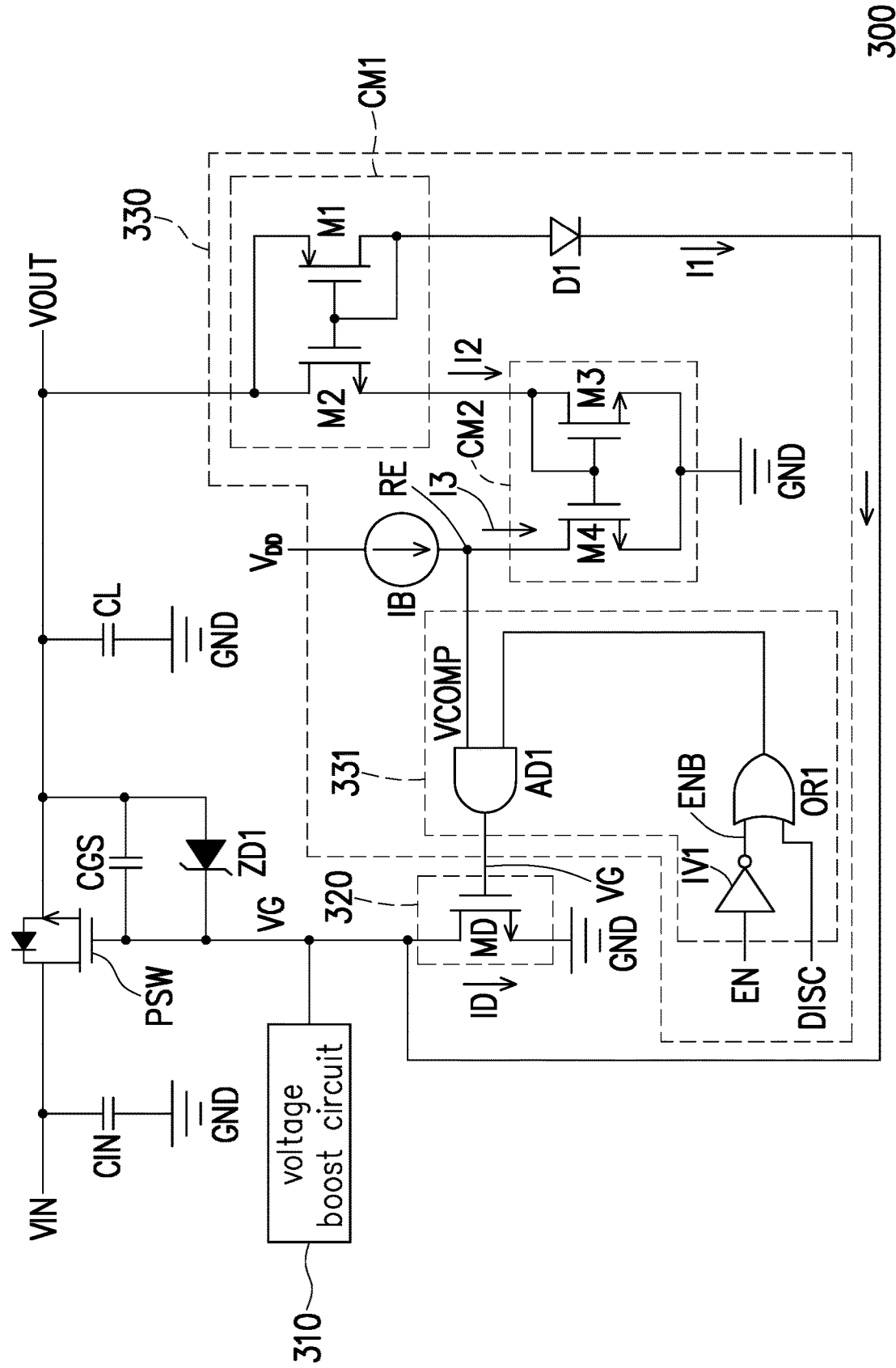
FIG. 3 is a schematic view of a control device of a power switch according to another embodiment of the disclosure.

In the following paragraphs, referring to FIG. 3, FIG. 3 is a schematic view of a control device of a power switch according to another embodiment of the disclosure. In the embodiment, the first end of the power switch PSW receives the input voltage VIN, the second end of the power switch PSW generates the output voltage VOUT, and the control end of the power switch PSW receives the control voltage VG. Moreover, the first end and the second end of the power switch PSW are coupled to capacitors CIN and CL, respectively. There is a capacitor CGS between the control end and the second end of the power switch PSW, and the Zener diode ZD1 is connected to the capacitor CGS in parallel.

A control device 300 includes a voltage boost circuit 310, a discharge circuit 320, and a bias voltage generating circuit 330. The voltage boost circuit 310 is coupled to the control end of the power switch PSW and used to provide the control voltage VG. The discharge circuit 320 includes the transistor MD and is coupled between the control end of the power switch PSW and the reference ground end GND. The discharge circuit 320 generates a discharge path between the control end of the power switch PSW and the reference ground end GND according to a bias voltage VB.

The bias voltage generating circuit 330 includes current mirrors CM1 and CM2, a reference current source IB, and a logic operator 331. The current mirror CM1 includes transistors M1 and M2. The current mirror CM1 receives the output voltage VOUT and the control voltage VG. In the current mirror CM1, the transistor M1 compares the difference between the output voltage VOUT and the offset voltage to the control voltage VG to generate a first current Ti. The current mirror CM1 mirrors the first current Ti to generate a second current I2 through the transistor M2.

The current mirror CM2 includes transistors M3 and M4. The transistor M3 receives the second current I2 and mirrors the second current I2 to generate a third current I3 through the transistor M4. The reference current source IB is coupled to the transistor M4 and a reference end RE. The reference current source IB provides the input end of the AND gate AD1 with a reference current, and the transistor M4 draws the third current I3 from the reference end RE. Accordingly, the comparison result VCOMP can be generated on the reference end RE, and the voltage amount of the comparison result VCOMP is determined according to whether the third current I3 is greater than the reference current provided by the reference current source IB.

In the embodiment, the current mirror ratio provided by the current mirror CM1 can be 1:1, and the current mirror ratio provided by the current mirror CM1 can be 1:M, where M is a real number greater than 1.

In the embodiment, the current mirrors CM1 and CM2 and the reference current source IB constitute a comparator. When the control voltage VG is greater than the difference between the output voltage VOUT and the offset voltage, the third current I3 generated by the current mirrors CM1 and CM2 is much less than the reference current provided by the reference current source IB, and the comparison result VCOMP on the reference end RE has a relatively high voltage value and is equivalent to logic 1. In contrast, when the control voltage VG is less than the difference between the output voltage VOUT and the offset voltage, the third current I3 generated by the current mirrors CM1 and CM2 can be greater than the reference current provided by the reference current source IB, and the comparison result VCOMP on the reference end RE has a relatively low voltage value and is equivalent to logic 0.

Furthermore, an offset voltage generator configured by a diode D1 can be disposed between the transistor M1 in the current mirror CM1 and the control end of the power switch PSW. The sum of the turn-on voltage VTH, D of the diode D1 and the turn-on voltage VTH, M1 of the transistor M1 can be used as the offset voltage. When the control voltage VG is greater than the difference between the output voltage VOUT and the offset voltage, the first current I1 is substantially equal to zero. When the control voltage VG is less than the sum of the output voltage VOUT and the offset voltage, the first current I1 is greater than zero.

The logic operator 331 includes the AND gate AD1, the OR gate OR1, and the inverter IV1. The inverter IV1 receives the switch on/off signal EN and generates the reverse switch on/off signal ENB. The OR gate OR1 receives the reverse switch on/off signal ENB and the abnormal signal DISC and generates the first operation signal. The AND gate AD1 receives the comparison result VCOMP and the first operation signal, generates the second operation signal, and provides the bias voltage VB according to the second operation signal. The bias voltage VB is supplied to the transistor MD in the discharge circuit 320. When the transistor MD is turned on, a discharge current ID can be generated.

Figure 4:
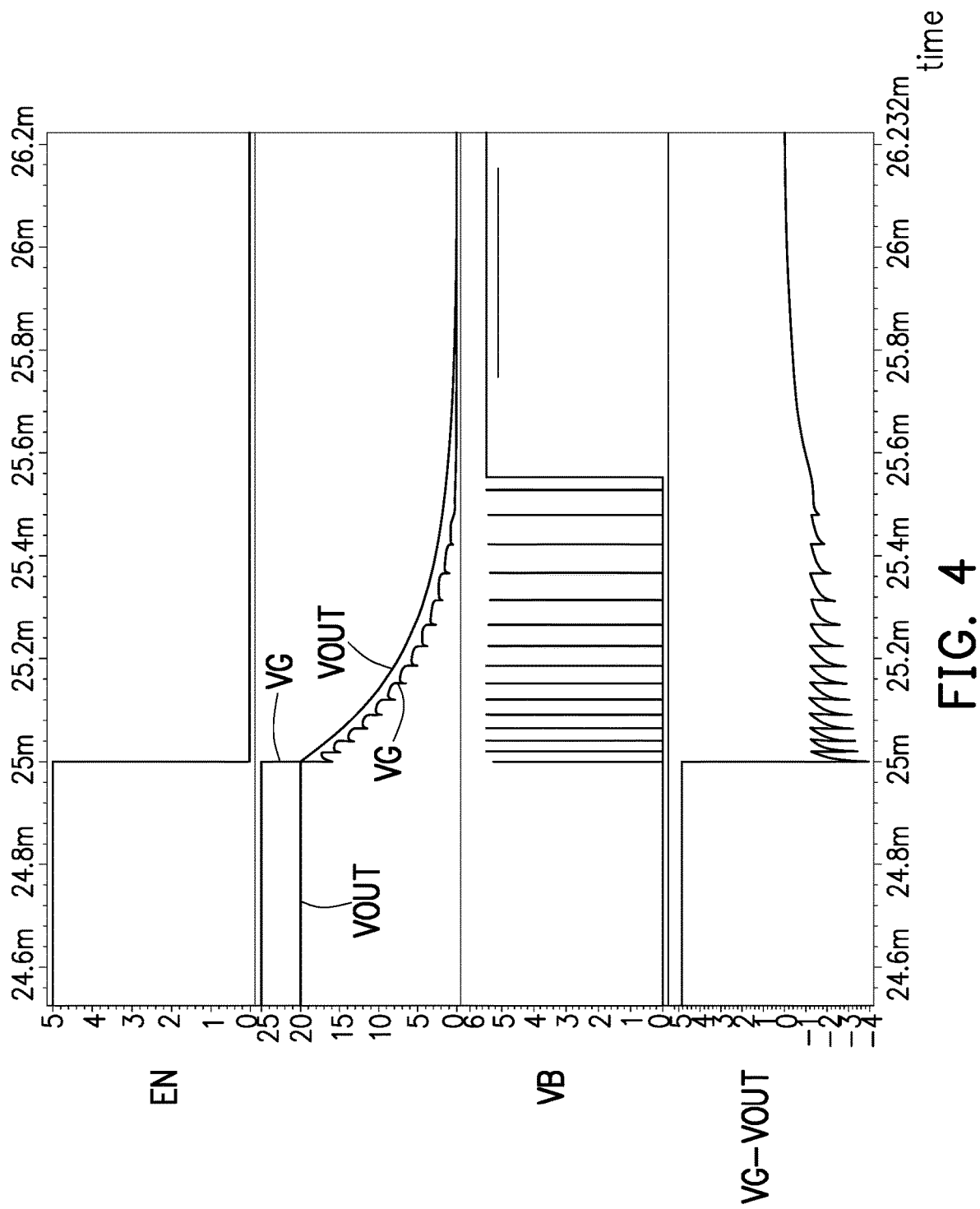
FIG. 4 and FIG. 5 respectively are waveform diagrams illustrating the control device in different states according to the embodiments of the disclosure.

In the following paragraphs, referring to FIG. 3, FIG. 4 and FIG. 5 respectively are waveform diagrams illustrating the control device in different states according to the embodiment of the disclosure. In FIG. 4, the horizontal axis represents time, and the vertical axis represents voltage.

In FIG. 4, the switch on/off signal EN is originally logic 1. At the stage, the output voltage VOUT is substantially equal to the input voltage VIN and less than the control voltage VG. In the embodiment, the control voltage VG minus the output voltage VOUT (VG-VOUT) is approximately equal to 5 volts. Moreover, since the switch on/off signal EN is logic 1, the bias voltage VB is logic 0.

Then, the switch on/off signal EN changes from logic 1 to logic 0; the bias voltage generating circuit 330 generates multiple pulses that are logic 1 according to the comparison control voltage VG, the output voltage VOUT, and the offset voltage; and the control voltage VG is gradually reduced with the decrease of the output voltage VOUT. Accordingly, the voltage difference between the control voltage VG and the output voltage VOUT can be effectively controlled to be greater than −5 volts, so the amount of bias that the power switch PSW bears is maintained and the probability of damage to the power switch PSW is reduced.

When the control voltage VG and the output voltage VOUT are both reduced to 0 volts, the power switch PSW is turned off, the bias voltage VB is maintained at logic 1, and the transistor MD is constantly turned on.

Figure 5:
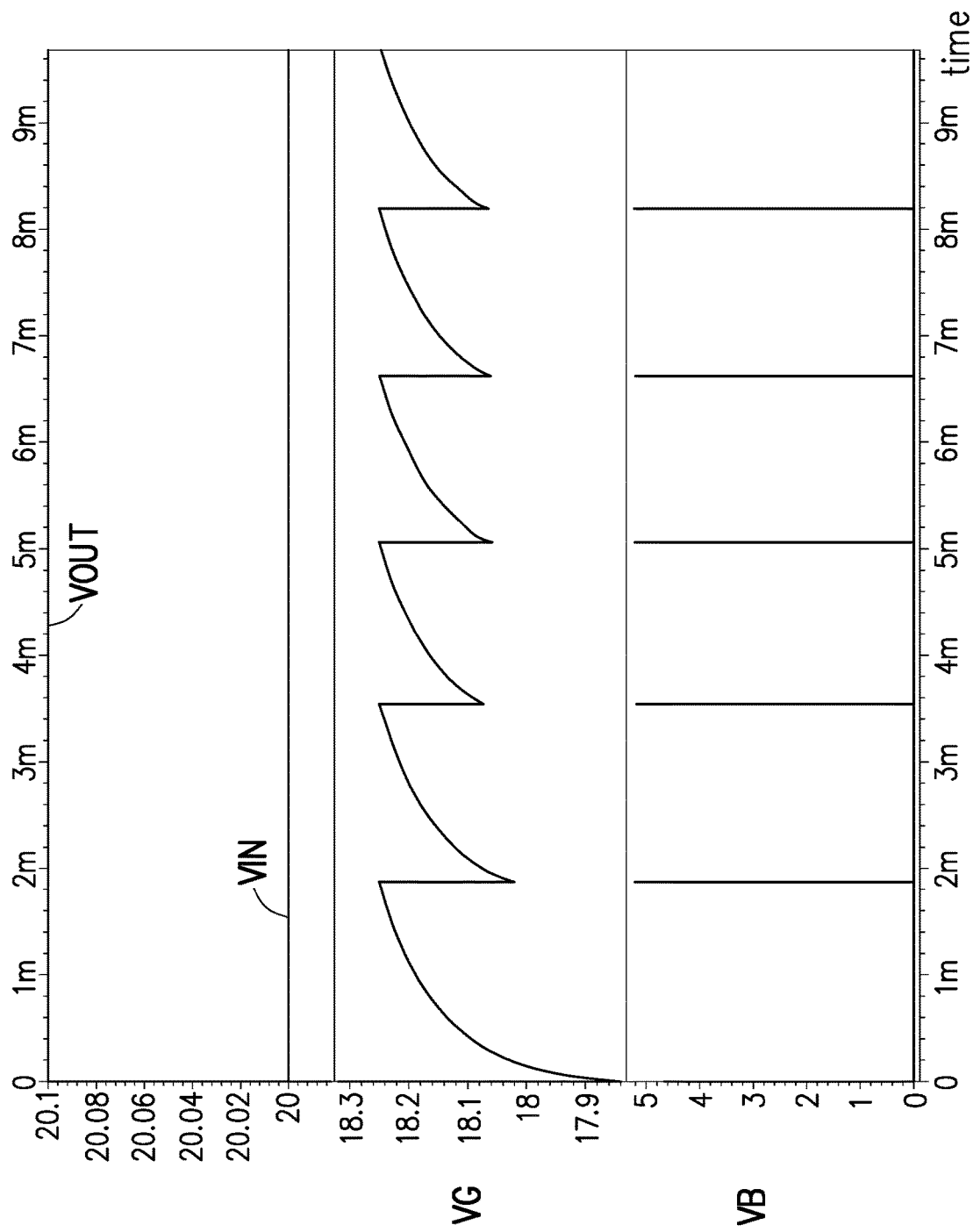

In FIG. 5, the switch on/off signal EN is equal to logic 1, so when the input voltage VIN is equal to 20 volts and the output voltage VOUT is equal to 20.1 volts, for example, the so-called reverse voltage phenomenon occurs, and the reverse voltage protection mechanism can be activated.

Under the reverse voltage protection mechanism, the abnormal signal DISC can be logic 1. Meanwhile, under the condition that the offset voltage is set to 1.9 volts, the bias voltage generating circuit 330 can generate multiple pulses that are logic 1 from the bias voltage VB, and the voltage of the control voltage VG is discharged to 18.1 volts by the discharge circuit 220.

Figure 6:
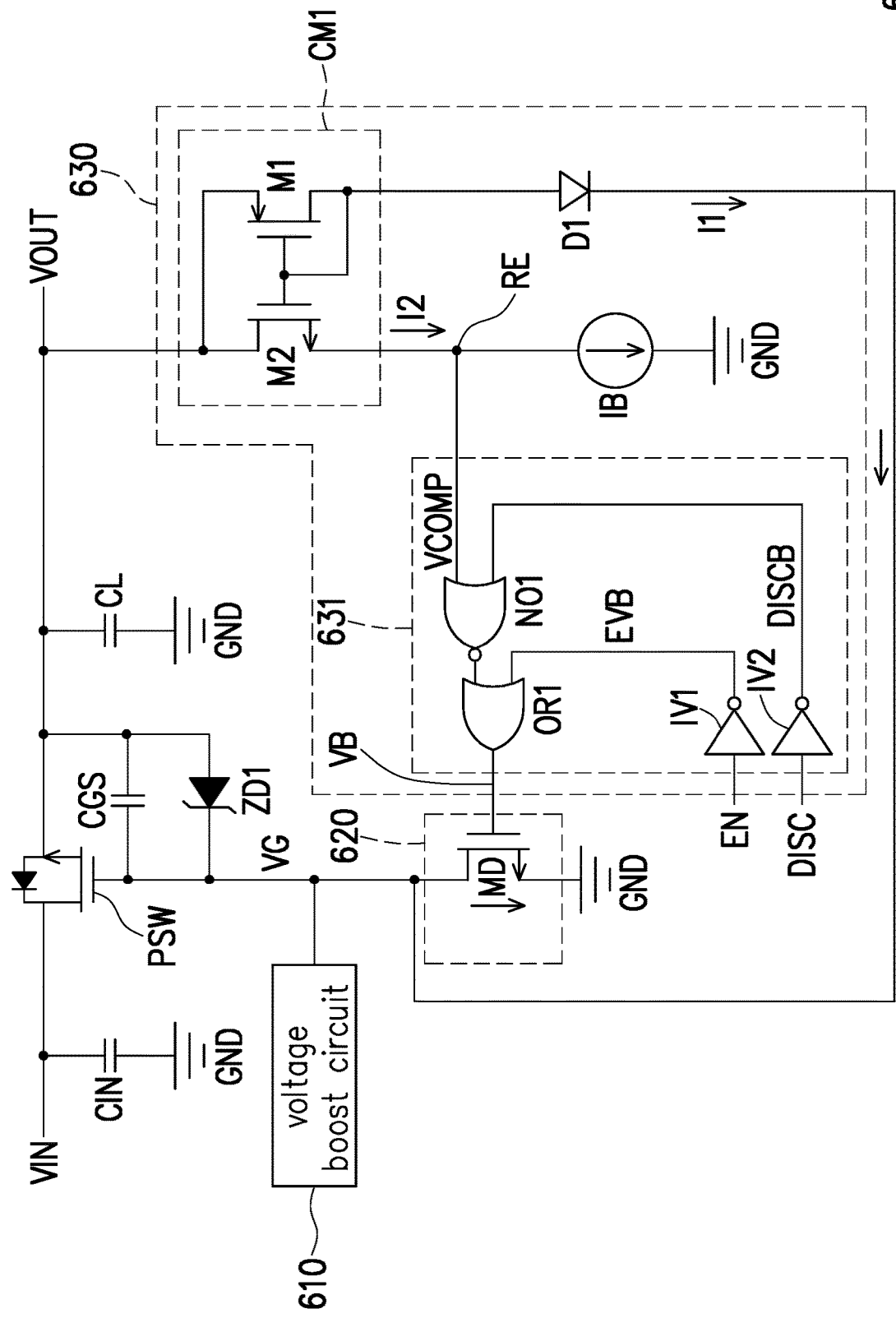
FIG. 6 is a schematic view of a control device of a power switch according to another embodiment of the disclosure.

Referring to FIG. 6, FIG. 6 is a schematic view of a control device of a power switch according to another embodiment of the disclosure. In the embodiment, the first end of the power switch PSW receives the input voltage VIN, the second end of the power switch PSW generates the output voltage VOUT, and the control end of the power switch PSW receives the control voltage VG. Moreover, the first end and the second end of the power switch PSW are respectively coupled to the capacitors CIN and CL. There is the capacitor CGS between the control end and the second end of the power switch PSW, and the Zener diode ZD1 is connected to the capacitor CGS in parallel.

A control device 600 includes a voltage boost circuit 610, a discharge circuit 620, and a bias voltage generating circuit 630. The voltage boost circuit 610 is coupled to the control end of the power switch PSW and used to provide the control voltage VG. The discharge circuit 620 includes the transistor MD and is coupled between the control end of the power switch PSW and the reference ground end GND. The discharge circuit 620 generates a discharge path between the control end of the power switch PSW and the reference ground end GND according to a bias voltage VB.

The bias voltage generating circuit 630 includes the current mirror CM1, the diode D1, the reference current source IB, and a logic operator 631. The current mirror CM1 includes the transistors M1 and M2. The current mirror CM1 compares the difference between the output voltage VOUT and the offset voltage to the control voltage VG and generates the first current I1 according to the comparison result. The transistor M2 mirrors the first current I1 to generate the second current I2 and provides the reference end RE with the second current I2. The current mirror ratio of the current mirror CM1 can be 1:1.

The reference current source IB is disposed between the reference end RE and the reference ground voltage GND and draws a reference current for the reference end RE.

According to the magnitude relationship between the reference current and the second current I2, the reference end RE can generate the comparison result VCOMP. When the second current I2 is greater than the reference current, the comparison result VCOMP may be logic 1; and when the second current I2 is less than the reference current, the comparison result VCOMP may be logic 0.

The sum of the turn-on voltages of the diode D1 and the transistor M1 in the embodiment can be used as the offset voltage.

The logic operator 631 includes an inverting OR gate NO1, the OR gate OR1, and the inverters IV1 and IV2. The inverters IV1 and IV2 respectively receive the switch on/off signal EN and the abnormal signal DISC and respectively generate the reverse switch on/off signal ENB and a reverse abnormal signal DISCB. The reverse OR gate NO1 receives the comparison result VCOMP and the reverse abnormal signal DISCB and generates the first operation signal. The OR gate OR1 receives the first operation signal and the reverse the switch on/off signal ENB and generates the second operation signal. Then, the bias voltage VB is provided according to the second operation signal.

Note that in the embodiments of FIG. 2, FIG. 3, and FIG. 6 of the disclosure, the circuit structures in the logic operators 231, 331, and 631 are all examples for illustration. It should be understood that in the design of logic circuits, the same logic expression can be completed by using a variety of different logic circuits. Therefore, the circuit structures of the logic operators 231, 331, and 631 in the embodiments of FIG. 2, FIG. 3, and FIG. 6 of the disclosure are not intended to limit the scope of the disclosure.

Based on the above, in the disclosure, when the power switch needs to be turned off, the control voltage is discharged by detecting the difference between the control voltage and the output voltage. The voltage difference between the control voltage and the output voltage of the power switch can be prevented from being too large, so the probability of damage to the power switch may be prevented, and thereby the service life of the power switch is increased.

What is claimed is:

1. A control device of a power switch, comprising:
a voltage boost circuit coupled to a control end of the power switch and boosting a base voltage to generate a control voltage at the control end of the power switch;
a discharge circuit coupled between the control end of the power switch and a reference ground end and generating a discharge path between the control end of the power switch and the reference ground end according to a bias voltage; and
a bias voltage generating circuit coupled to the discharge circuit, comparing an output voltage at an output end of the power switch to the control voltage to generate a comparison result, and generating the bias voltage according to the comparison result.

2. The control device according to claim 1, wherein the bias voltage generating circuit further generates the bias voltage according to a switch on/off signal, an abnormal signal, and the comparison result.

3. The control device according to claim 1, wherein the bias voltage generating circuit generates the bias voltage to enable the discharge circuit to generate the discharge path when the control voltage is greater than a difference between the output voltage and an offset voltage.

4. The control device according to claim 1, wherein the bias voltage generating circuit comprises:
a comparator comprising a positive input end to receive the control voltage, a negative input end of the comparator to receive the output voltage, and an output end of the comparator to generate the comparison result; and
a logic operator performing a logic operation on a switch on/off signal, an abnormal signal, and the comparison result and generating the bias voltage according to the operation result.

5. The control device according to claim 4, wherein the logic operator comprises:
an inverter receiving the switch on/off signal and generating a reverse switch on/off signal;
an OR gate receiving the reverse switch on/off signal and the abnormal signal and generating a first operation signal;
an AND gate receiving the comparison result and the first operation signal to generate a second operation signal and providing the bias voltage through the second operation signal.

6. The control device according to claim 1, wherein the bias voltage generating circuit comprises:
a first current mirror receiving the output voltage and the control voltage, generating a first current according to a difference between the output voltage and the control voltage, and mirroring the first current to generate a second current;

a second current mirror receiving the second current and mirroring the second current to generate a third current;

a reference current source providing a reference current to a reference end of the second current mirror to generate the third current;

a logic operator performing a logic operation on a switch on/off signal, an abnormal signal, and the voltage on the reference end and providing the bias voltage according to the operation result.

7. The control device according to claim 6, wherein the bias voltage generating circuit further comprises:
    an offset voltage generator coupled between the first current mirror and the control end of the power switch to provide an offset voltage.

8. The control device according to claim 1, wherein the bias voltage generating circuit comprises:
    a current mirror receiving the output voltage and the control voltage, generating a first current according to a difference between the output voltage and the control voltage, and mirroring the first current to generate a second current;
    a reference current source coupled to a reference end of the current mirror that generates the second current;
    a logic operator performing a logic operation on a switch on/off signal, an abnormal signal, and the voltage on the reference end and providing the bias voltage according to the operation result.

9. The control device according to claim 8, wherein the logic operator comprises:
    a first inverter receiving the switch on/off signal and generating a reverse switch on/off signal;
    a second inverter receiving the abnormal signal and generating a reverse abnormal signal;
    a reverse OR gate receiving the reverse abnormal signal and the voltage on the reference end to generate a first operation signal; and
    an OR gate receiving the reverse switch on/off signal and the first operation signal, generating a second operation signal, and providing the bias voltage according to the second operation signal.

10. The control device according to claim 9, wherein the bias voltage generating circuit further comprises:
    an offset voltage generator coupled between the first current mirror and the control end of the power switch to provide an offset voltage.

* * * * *